(12) United States Patent
Arena et al.

(10) Patent No.: US 6,998,305 B2
(45) Date of Patent: Feb. 14, 2006

(54) ENHANCED SELECTIVITY FOR EPITAXIAL DEPOSITION

(75) Inventors: Chantal J. Arena, Mesa, AZ (US); Joe P. Italiano, Phoenix, AZ (US); Paul D. Brabant, Phoenix, AZ (US)

(73) Assignee: ASM America, Inc., Phoenix, AZ (US)

( * ) Notice: Subject to any disclaimer, the term of this patent is extended or adjusted under 35 U.S.C. 154(b) by 65 days.

(21) Appl. No.: 10/763,948

(22) Filed: Jan. 23, 2004

(65) Prior Publication Data

US 2004/0171238 A1 Sep. 2, 2004

Related U.S. Application Data

(60) Provisional application No. 60/442,694, filed on Jan. 24, 2003.

(51) Int. Cl.
*H01L 21/8238* (2006.01)

(52) U.S. Cl. ....................... 438/216; 438/592

(58) Field of Classification Search ................ 438/216, 438/299, 300, 301, 305, 585, 592
See application file for complete search history.

(56) References Cited

U.S. PATENT DOCUMENTS

| 4,578,142 A | 3/1986 | Corboy |
|---|---|---|
| 4,698,316 A | 10/1987 | Corboy |
| 4,704,186 A | 11/1987 | Jastrzebski |
| 4,710,241 A | 12/1987 | Komatsu |
| 4,728,623 A | 3/1988 | Lu |
| 4,735,918 A | 4/1988 | Parsons |
| 4,749,441 A | 6/1988 | Christenson |
| 4,758,531 A | 7/1988 | Beyer |
| 4,778,775 A | 10/1988 | Tzeng |
| 4,786,615 A | 11/1988 | Liaw |
| 4,793,872 A | 12/1988 | Meunier |
| 4,834,809 A | 5/1989 | Kakihara |
| 4,857,479 A | 8/1989 | McLaughlin |
| 4,873,205 A | 10/1989 | Critchlow |
| 4,891,092 A | 1/1990 | Jastrzebski |
| 4,897,366 A | 1/1990 | Smeltzer |
| 4,923,826 A | 5/1990 | Jastrzebski |
| 4,966,861 A | 10/1990 | Mieno |
| 4,981,811 A | 1/1991 | Feygenson |
| 5,004,705 A | 4/1991 | Blackstone |
| 5,037,775 A | 8/1991 | Reisman |
| 5,045,494 A | 9/1991 | Choi |

(Continued)

*Primary Examiner*—Phuc T. Dang
(74) *Attorney, Agent, or Firm*—Knobbe, Martens, Olsen and Bear LLP

(57) ABSTRACT

A method of forming an electronic component having elevated active areas is disclosed. The method comprises providing a semiconductor substrate in a processing chamber. The semiconductor substrate has disposed thereon a polycrystalline silicon gate and exposed active areas. The method further comprises performing a deposition process in which a silicon-source gas is supplied into the processing chamber to cause polycrystalline growth on the gate and epitaxial deposition on the active areas. The method further comprises performing a flash etch back process in which polycrystalline material is etched from the gate at a first etching rate and the epitaxial layer is etched from the active areas at a second etching rate. The first etching rate is faster than the second etching rate. The deposition process and the flash etch back process can be repeated cyclically, if desired. In certain other embodiments, the deposition process is a selective epitaxial deposition process, wherein growth occurs in non-oxide regions, but not in oxide regions.

40 Claims, 2 Drawing Sheets

U.S. PATENT DOCUMENTS

| | | |
|---|---|---|
| 5,059,544 A | 10/1991 | Burghartz |
| 5,061,644 A | 10/1991 | Yue |
| 5,061,655 A | 10/1991 | Ipposhi |
| 5,112,439 A | 5/1992 | Reisman |
| 5,146,304 A | 9/1992 | Yue |
| 5,148,604 A | 9/1992 | Bantien |
| 5,164,813 A | 11/1992 | Blackstone et al. |
| 5,175,121 A | 12/1992 | Choi et al. |
| 5,182,619 A | 1/1993 | Pfiester |
| 5,201,995 A | 4/1993 | Reisman et al. |
| 5,234,857 A | 8/1993 | Kim et al. |
| 5,236,546 A | 8/1993 | Mizutani |
| 5,269,876 A | 12/1993 | Mizutani |
| 5,282,926 A | 2/1994 | Trah et al. |
| 5,324,679 A | 6/1994 | Kim et al. |
| 5,356,510 A | 10/1994 | Pribat et al. |
| 5,403,751 A | 4/1995 | Nishida et al. |
| 5,416,354 A | 5/1995 | Blackstone |
| 5,422,302 A | 6/1995 | Yonehara et al. |
| 5,563,085 A | 10/1996 | Kohyama |
| 5,591,492 A | 1/1997 | Hirai et al. |
| 5,798,278 A | 8/1998 | Chan et al. |
| 5,967,794 A | 10/1999 | Kodama |
| 6,057,200 A | 5/2000 | Prall et al. |
| 6,153,010 A | 11/2000 | Kiyoku et al. |
| 6,190,976 B1 * | 2/2001 | Shishiguchi et al. ........ 438/299 |
| 6,225,650 B1 | 5/2001 | Tadatomo et al. |
| 6,335,251 B2 | 1/2002 | Miyano et al. |
| 6,348,096 B1 | 2/2002 | Sunakawa et al. |
| 6,376,318 B1 | 4/2002 | Lee et al. |
| 6,555,845 B2 | 4/2003 | Sunakawa et al. |
| 2001/0046766 A1 * | 11/2001 | Asakawa .................... 438/648 |
| 2003/0082300 A1 | 5/2003 | Todd et al. |

* cited by examiner

ENHANCED SELECTIVITY FOR EPITAXIAL DEPOSITION

RELATED APPLICATION

This application claims priority under 35 U.S.C. § 119(e) from U.S. Provisional Patent Application Ser. No. 60/442,694, entitled "Enhanced Selectivity for Epitaxial Deposition" and filed Jan. 24, 2003. The entire disclosure of this priority document is hereby incorporated by reference in its entirety.

FIELD OF THE INVENTION

The present invention relates generally to methods for forming integrated circuits, and particularly to selective epitaxial deposition.

BACKGROUND OF THE INVENTION

Certain electronic components, such as field effect transistors, include a semi-conductive substrate having two distinct diffusion regions. The diffusion regions are generally referred to as a source and a drain. A gate is positioned adjacent the substrate between the source and the drain. Imparting a voltage to the gate sets up an electric field that enables current flow between the source and the drain through a channel in the portion of the substrate adjacent the gate. The substrate typically comprises a bulk monocrystalline silicon substrate having a relatively light concentration of a conductivity enhancing dopant impurity. In other configurations, the substrate comprises a thin layer of lightly doped semi-conductive material disposed over an underlying insulating layer. Such structures are commonly referred to as semiconductor-on-insulator ("SOI") constructions.

As integrated circuit ("IC") designs become more dense, the length and size of the channel becomes smaller. In addition, the junction depth, which is the thickness of the source or drain, also becomes smaller. As IC features such as channel length, channel size and junction depth become smaller, certain unwanted side effects can occur. For example, a small channel will increase the lateral electric field within the substrate, which can lead to performance degradation. Additionally, small junction depths can prevent adequate silicon consumption during a self aligned silicide ("SALICIDE") process.

To address these problems, an elevated source/drain ("ESD") structure has been developed. In an ESD structure, a portion of the source and drain regions are elevated above the substrate. For example, a thin epitaxial layer of monocrystalline silicon can be selectively grown from exposed monocrystalline silicon source and drain substrate areas. As used herein, "selective" growth includes, but is not limited to, growth only in particular regions of an underlying structure. For example, in certain applications, selective growth may occur only over non-oxide regions of a substrate, while non-selective growth would occur over an entire substrate, including oxide regions.

Epitaxial deposition of silicon is well known in the semiconductor device processing art, and involves the precipitation of silicon from a source gas onto a crystal lattice. The deposited silicon forms a structure that replicates and extends the underlying crystal lattice. Conventionally used silicon source gases include silane ($SiH_4$), silicon tetrachloride ($SiCl_4$), trichlorosilane ($SiHCl_3$) and dichlorosilane ($SiH_2Cl_2$).

Additional background information on selective epitaxial deposition of silicon can be found in U.S. Pat. No. 4,578,142 to Corboy, Jr. et al., entitled "METHOD FOR GROWING MONOCRYSTALLINE SILICON THROUGH MASK LAYER" and filed on May 10, 1984. The entire disclosure of this patent is hereby incorporated herein by reference.

An ESD structure provides sufficient channel length to avoid unwanted side effects, despite the presence of a smaller (narrower) gate. Additionally, sufficient silicon consumption can be provided during the SALICIDE process.

SUMMARY OF THE INVENTION

Thus, it is desired to develop improved methods for forming an elevated source/drain ("ESD") structure. In particular, it is desired to selectively deposit a thin epitaxial layer of monocrystalline silicon on the source and drain regions without causing deposition on any isolation dielectrics (such as oxide regions), as is known in the art.

Additionally, if a polycrystalline silicon gate is used, undesired polycrystalline silicon will form on the gate during monocrystalline silicon deposition on the source and drain substrate areas. Excessive polycrystalline silicon deposition on the gate can cause the gate to short to the elevated source and drain regions. Excessive polycrystalline silicon deposition on the gate or elsewhere during the selective deposition can also produce unwanted surface roughness that can present problems in subsequent processing, such as for example, subsequent lithography steps. Therefore, it is desired to minimize or eliminate polycrystalline silicon deposition on the gate during deposition of monocrystalline silicon to form an ESD structure.

Accordingly, in one embodiment of the present invention, a method of forming an electronic component having elevated active areas includes providing a semiconductor substrate in a processing chamber. The semiconductor substrate has disposed thereon a polycrystalline silicon gate and exposed active areas. The method further includes performing a deposition process in which a silicon-source gas is supplied into the processing chamber to cause polycrystalline silicon to be deposited on the gate and epitaxial silicon to be deposited on the active areas. The method further comprises performing a flash etch back process in which polycrystalline silicon is etched from the gate at a first etching rate and epitaxial silicon is etched from the active areas at a second etching rate. The first etching rate is faster than the second etching rate.

In another embodiment of the present invention, a method includes providing a semiconductor substrate having a gate and exposed active areas. The method further includes depositing polycrystalline silicon on the gate and epitaxial silicon on the active areas in a first process step. The method further comprises etching polycrystalline silicon from the gate in a second process step. The method further comprises repeating the first and second process steps a plurality of times.

In another embodiment of the present invention, a method includes providing a semiconductor substrate in a processing chamber. The semiconductor substrate has a first growth region and a second growth region. The method further includes performing a deposition process in which epitaxial growth occurs at an epitaxial growth rate in the first growth region and polycrystalline growth occurs at a polycrystalline growth rate in the second growth region. The method further includes controlling the epitaxial growth rate and the polycrystalline growth rate by periodically pausing the deposition process to perform a flash etch back process. After the flash etch back process, there is more epitaxial growth than polycrystalline growth present on the semiconductor substrate.

In another embodiment of the present invention, a method includes providing a semiconductor substrate in a processing chamber. The semiconductor substrate has at least one oxide region and at least one non-oxide region. The method further includes alternating a selective epitaxial growth process with a flash etch back process. During the selective epitaxial growth process, epitaxial growth comprising polycrystalline growth and monocrystalline growth occurs in the at least one non-oxide region. Also during the selective epitaxial growth process, substantially no deposition occurs in the at least one oxide region. During the flash etch back process, at least a portion of the polycrystalline growth is etched from the at least one non-oxide region.

BRIEF DESCRIPTION OF THE DRAWINGS

These and other embodiments of the present invention will be readily apparent to the skilled artisan from the following description and the attached drawings.

DETAILED DESCRIPTION OF PREFERRED EMBODIMENTS

As expounded in detail below, the present disclosure provides methods of fabricating an improved ESD structure. In particular, the present disclosure provides methods for reducing unwanted polycrystalline silicon deposition on a gate region during formation of an elevated ESD structure. However, one of ordinary skill in the art will recognize that the methods disclosed herein also can be applied to any deposition process wherein epitaxial deposition is desired in a first region, while controlled non-epitaxial deposition at a different rate is desired in a second region. "Controlled" deposition, as used herein, means that the rate of deposition in the second region can vary from 0% to nearly 100% of the rate of epitaxial deposition in the first region.

Figure 1:
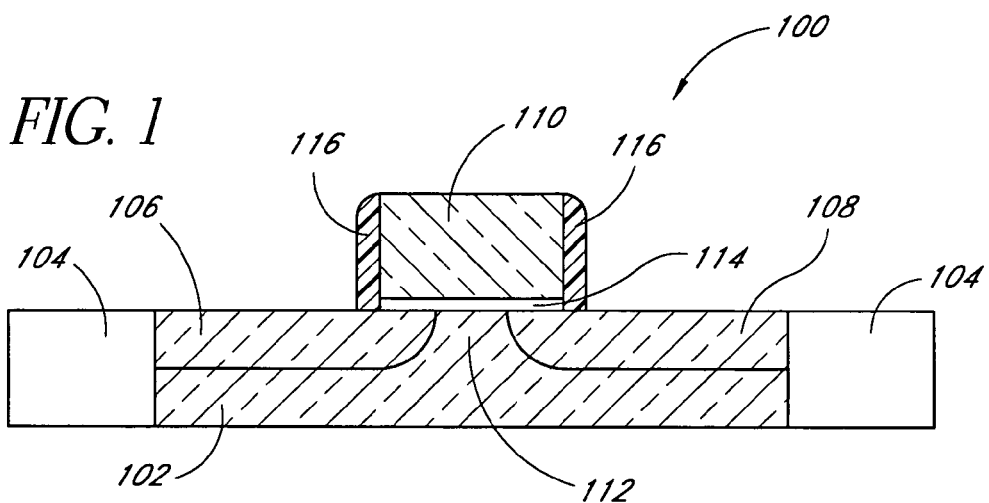
FIG. 1 is a cross-sectional schematic illustration of a conventional field effect transistor, in accordance with the prior art.

FIG. 1 illustrates the basic structure of a conventional field effect transistor 100. The field effect transistor 100 comprises a substrate 102 and shallow trench isolation regions 104. The substrate 102 is formed of any of the commonly used substrate materials, including silicon, gallium arsenide, or the like. The shallow trench isolation regions 104 can be formed in a conventional manner within the device, and are typically formed of silicon dioxide ($SiO_2$). The isolation regions 104 can also be formed on the surface of the substrate 102 by partial oxidation of the substrate surface.

Active areas can be formed within the substrate 102 by various processes, such as by introducing an impurity into the substrate 102 up to several microns deep by ion implantation and activation by rapid thermal annealing ("RTA"). For example, in one embodiment, RTA occurs at approximately 850° C. Preferably, two separate active areas are formed: the source 106 and the drain 108. Both n-channel and p-channel transistors can be formed in accordance with the various embodiments described herein.

Still referring to FIG. 1, a gate dielectric film 114 is formed over the substrate 102. The gate dielectric film 114 typically comprises a layer of $SiO_2$ that is between 5 nm and 20 nm thick, and is typically grown by thermally oxidizing the underlying silicon substrate 102. However, newer high k materials are under investigation. A gate electrode 110 is then formed on the gate dielectric film 114. The gate electrode 110 is typically about 300 nm high, and comprises a conductive material such as polycrystalline silicon, silicon germanium (SiGe) or a metal (such as, for example, tungsten, titanium nitride, and so forth). Conventionally, the gate electrode 110 is formed of polycrystalline silicon (also referred to as "polysilicon"). Insulating sidewall spacers 116 are disposed on the sides of the gate 110. For example, in one embodiment, sidewall spacers 116 comprise a silicon nitride film having a thickness of approximately 20 nm.

Figure 2:
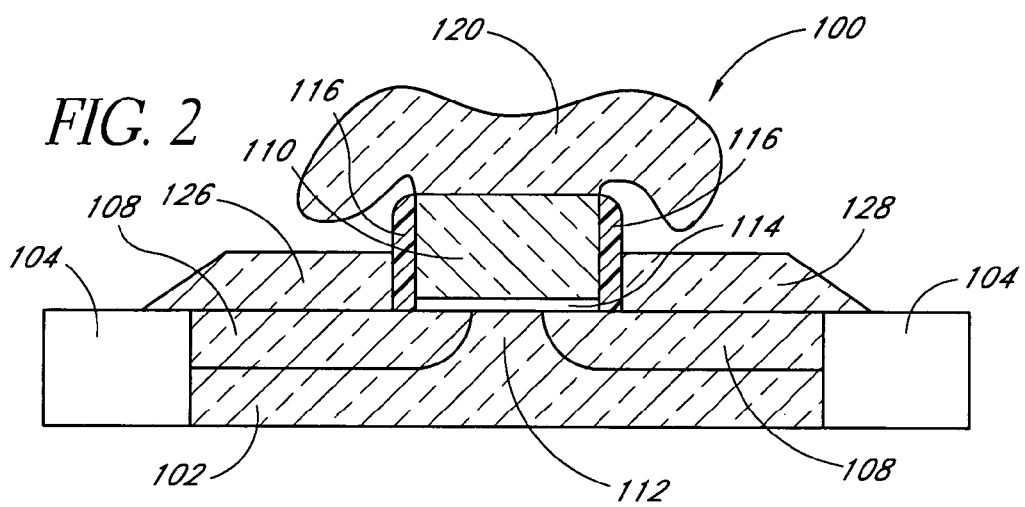
FIG. 2 is a cross-sectional schematic illustration of the field effect transistor of FIG. 1 after a selective epitaxial deposition process, in accordance with the prior art.

Conventionally used silicon source gases include $SiH_4$, $SiCl_4$, $SiHCl_3$ and $SiH_2Cl_2$. As disclosed in U.S. patent application Ser. No. 10/074,563, entitled "PROCESS FOR DEPOSITION OF SEMICONDUCTOR FILMS" and filed on Feb. 11, 2002, the entire disclosure of which is hereby incorporated herein by reference, trisilane ($Si_3H_8$) can also be used as a silicon source gas. The structure of the field effect transistor 100 after a conventional selective epitaxial growth process is illustrated in FIG. 2. As illustrated, epitaxial growth occurs over the source 106 and drain 108 depletion regions, thereby forming a monocrystalline silicon elevated source 126 and elevated drain 128 structure. Due to the nature of epitaxial growth, the monocrystalline silicon comprising the elevated source 126 and elevated drain 128 will substantially comprise two dimensional facets.

In addition, during conventional selective epitaxial deposition, polycrystalline growth occurs on the gate 110, forming a polycrystalline mushroom structure 120 atop the gate. An example of a polycrystalline mushroom structure is illustrated in FIG. 2. Due to the nature of polycrystalline growth, polycrystalline silicon deposited on the gate 110 during a conventional selective epitaxial deposition stage will substantially comprise multiple three dimensional facets having randomly oriented grains and grain boundaries. This crystalline structure causes the resulting polycrystalline growth to have a mushroom-shaped structure. Such a growth pattern creates the risk of an electrical short between the mushroom structure 120 and the elevated source 126 or elevated drain 128, and therefore can be excessive.

The presence of a silicon etching gas, such as hydrochloric acid (HCl), during the deposition stage preferably reduces the amount of polycrystalline growth on the isolation regions 104. Specifically, using known selective epitaxy processing techniques, the concentration of HCl present during the deposition stage can be optimized such that no growth is present on isolation regions 104. Additionally, HCl will reduce polycrystalline growth over the gate 110 during the deposition stage, thus increasing the effectiveness of subsequent etching stages.

To form an ESD structure, the field effect transistor 100 illustrated in FIG. 1 is subjected to a two stage, deposition/etching cycle. In the first stage, hereinafter referred to as the deposition stage, silicon is deposited from a gas mixture which includes a silicon source gas, a carrier gas, and optionally, an etching precursor.

The second stage of the silicon deposition/etching cycle is hereinafter referred to as the flash etch back process. In the flash etch back process, a portion of the material deposited during the deposition stage is etched in a mixture of an etching gas and a carrier gas. For example, in a preferred embodiment wherein silicon deposition was performed in the deposition stage, a conventionally used etching gas is HCl. In such preferred embodiments, other parameters of the flash etch back process are as follows:

TABLE 1

| Parameter | Preferred Value | Preferred Range |
| --- | --- | --- |
| Temperature | 800° C. | 400–1200° C. |
| HCl flow rate | 150 sccm | 75–225 sccm |
| Carrier gas ($H_2$) flow rate | 60 slm | 30–90 slm |
| Pressure | atmospheric | 1.0 torr–atmospheric |
| Etch rate | 40 Å $min^{-1}$ | 30–50 Å $min^{-1}$ |
| Duration | 50% of total deposition period | 30%–70% of total deposition period |

In certain embodiments, it may be desirable to conduct the flash etch back process at a higher temperature than the deposition process. One of ordinary skill in the art will recognize that other parameters may be more appropriate for certain applications. In a preferred embodiment, no deposition occurs during the flash etch back process.

Because polycrystalline silicon over the gate electrode 110 (as well as any polycrystalline silicon deposited on the isolation regions 104 for non-selective embodiments) has a discontinuous grainy three-dimensional structure with multiple facets, the etching gas can attack this structure from all three dimensions. In contrast, the epitaxial growth present over the elevated source 126 and elevated drain 128 has a smooth and flat two-dimensional crystalline structure, and thus etching in those regions will tend to be more two-dimensional. That is, there is more crystal surface exposed to etchants in polycrystalline structures than in monocrystalline structures. This morphological difference between polycrystalline growth and monocrystalline growth causes polycrystalline structures to be etched faster than monocrystalline structures during the flash etch back process. Thus, the net effect of the two stage deposition/etching cycle is to cause epitaxial structures to grow faster than polycrystalline structures over the course of multiple cycles.

Figure 3:
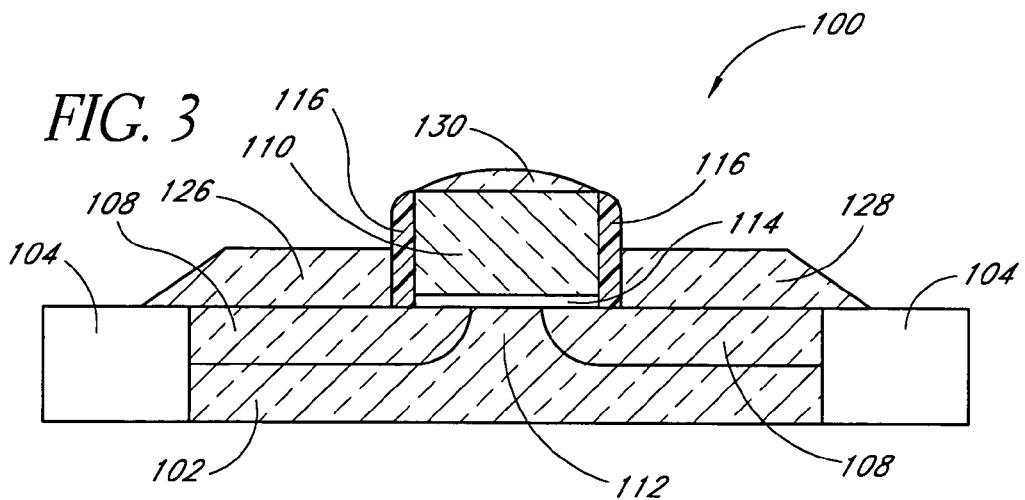
FIG. 3 is a cross-sectional schematic illustration of the field effect transistor of FIG. 1 after a selective epitaxial deposition process incorporating flash etch back, in accordance with a preferred embodiment of the present invention.

In a preferred embodiment, this two stage deposition/etching cycle is repeated any number of times, until the elevated source/drain structure acquires acceptable dimensions. The relative durations of deposition and etching stages in each cycle are selected to control polycrystalline growth over non-single crystal surfaces relative to epitaxial growth in the active areas. For example, FIG. 3 illustrates the structure of a field effect transistor 100 after the deposition/etching cycle has been repeated several times, such that the polycrystalline mushroom structure is not present; instead, a polycrystalline cap 130 having acceptable dimensions is present on the gate 110. In particular, because the polycrystalline cap 130 does not have a mushroom structure, there is no conductive material laterally extending directly above the active areas, thus effectively eliminating the risk of creating an electrical short between the polycrystalline cap 130 and the elevated source 126 or elevated drain 130. In other embodiments, polycrystalline growth on the gate 110 can be prevented completely.

Figure 4:
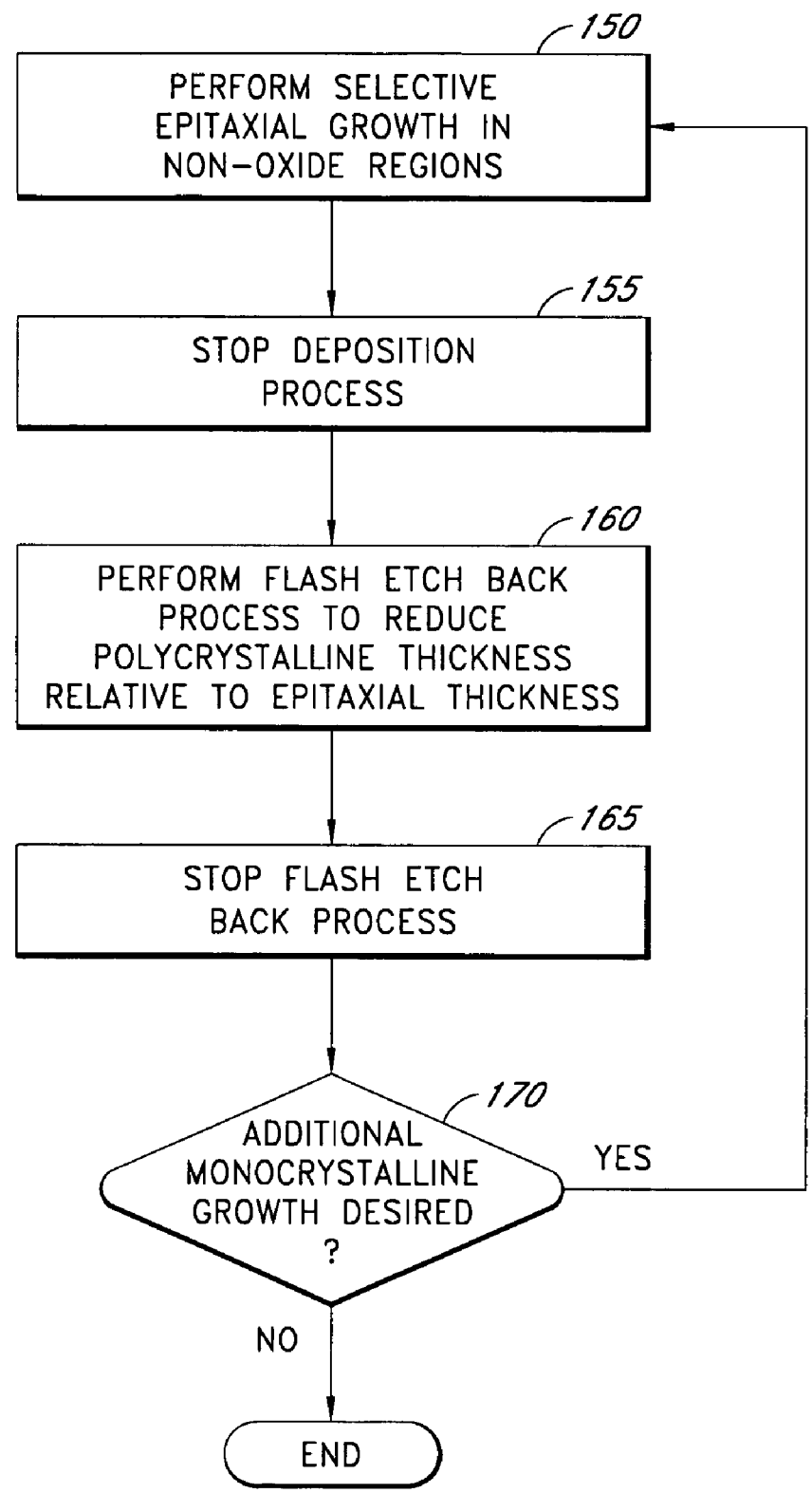
FIG. 4 is a flowchart illustrating a cyclical deposition/etching process in accordance with a preferred embodiment of the present invention.

This cyclical deposition/etching process is diagrammatically illustrated in the flowchart of FIG. 4. As illustrated, selective epitaxial growth in non-dielectric regions is performed in a deposition process 150. Such growth may lead to the existence of unwanted excessive polycrystalline growth in certain regions. To reduce or eliminate such growth, the deposition process is halted in an operational block 155. A flash etch back process 160 is then performed, in which unwanted polycrystalline growth is removed from the dielectric region. If, after the flash etch back process is halted in an operational block 165, additional monocrystalline growth is desired in certain regions (operational block 170), then the process is repeated as necessary.

Using the two stage deposition/etching cycle described above, selective epitaxial growth to form an ESD structure can be achieved. Separating deposition and etching into multiple successive steps permits the optimization of the deposition and etching steps independently. In particular, stopping deposition and switching to a pure etching process, the ratio of polycrystalline deposition to epitaxial deposition can be minimized, thus allowing a desired thickness of epitaxial growth to be deposited on the source 106 and drain 108, while minimizing the thickness of the polycrystalline cap 130 on the gate 110. Stated more generally, enhanced control of deposition selectivity can be achieved by using the two stage deposition/etching cycle disclosed herein by selecting an appropriate frequency and duration of the deposition and etching processes.

In contrast to the two stage deposition/etching cycle disclosed herein, conventional selective epitaxial deposition processes involve adjusting process parameters during deposition such that a high etch rate is maintained on the dielectrics while epitaxial deposition occurs. Such conventional processes are often optimized to eliminate net growth over dielectric regions. In processes that simultaneously etch polycrystalline structures while performing epitaxial growth, a limited ratio of about 20% more epitaxial growth than polycrystalline growth has been achieved. Additionally, such conventional processes suffer from reduced overall process deposition rates due to the presence of simultaneous deposition and etching, especially at low temperatures (for example, below 750° C.).

The preferred embodiments disclosed above have been described in the context of creating an ESD structure over a polycrystalline gate by modifying selective epitaxial growth. However, the embodiments disclosed herein are for exemplary purposes only, and are not intended to limit the scope of the present invention. For example, one of ordinary skill in the art will recognize that the techniques described herein are readily applicable in other contexts wherein it is desired to control the relative rates of epitaxial and polycrystalline growth in different regions of a substrate. In addition, a wide variety of single or multilevel structures can be made using the two stage deposition/etching cycle disclosed herein.

The foregoing describes various preferred embodiments for the present invention in such clear, concise and exact terms to enable any person of ordinary skill in the semiconductor processing art to use these techniques. These techniques are, however, susceptible to modifications and alternate implementations from those discussed above which are fully equivalent. Consequently, it is not the intention to limit the present invention to the particular embodiments disclosed. Rather, the intention is to cover all modifications and alternate implementations within the scope of the invention as set forth in the following claims. The following claims particularly point out and distinctly claim the subject matter of the present invention.

We claim:

1. A method of forming an electronic component having elevated active areas, the method comprising:

providing a semiconductor substrate in a processing chamber, the semiconductor substrate having disposed thereon a gate electrode and exposed active areas;

performing a deposition process in which a silicon-source gas is supplied into the processing chamber to cause a polycrystalline layer to be deposited on the gate electrode and an epitaxial layer to be deposited on the active areas; and performing a flash etch back process in which the polycrystalline layer is etched from the gate at a first etching rate and the epitaxial layer is etched from the active areas at a second etching rate, wherein the first etching rate is faster than the second etching rate.

2. The method of claim 1, wherein the semiconductor substrate further comprises a dielectric region, and wherein deposition on the dielectric region is substantially avoided during the deposition process.

3. The method of claim 1, wherein an etchant is also supplied into the processing chamber during the deposition process.

4. The method of claim 3, wherein the etchant is hydrochloric acid.

5. The method of claim 1, further comprising repeating the deposition process and the flash etch back process a plurality of times.

6. The method of claim 1, wherein the gate is elevated with respect to the active areas, such that during the flash etch back process the polycrystalline layer is etched in two orthogonal dimensions.

7. The method of claim 6, wherein after the flash etch back process is performed, no polycrystalline layer extends over a region directly above the active areas.

8. The method of claim 7, wherein no polycrystalline material is left on the gate electrode after repeating the deposition process and the flash etch back process a plurality of times.

9. The method of claim 1, wherein the deposition of the polycrystalline layer and the deposition of the epitaxial layer occur simultaneously.

10. The method of claim 1, wherein no deposition takes place during the flash etch back process.

11. The method of claim 1, wherein the deposition process is conducted at a lower temperature than the flash etch back process.

12. The method of claim 11, wherein the processing chamber is heated to a temperature between approximately 400° C. and approximately 1200° C. before the flash etch back process is commenced.

13. The method of claim 1, wherein the processing chamber is heated to a temperature between approximately 400° C. and approximately 1200° C. before the flash etch back process is commenced.

14. The method of claim 1, wherein hydrochloric acid is supplied to the processing chamber during the flash etch back process.

15. The method of claim 1, wherein the processing chamber is held at a pressure substantially equal to atmospheric pressure during the flash etch back process.

16. A method comprising:
providing a semiconductor substrate having a gate and exposed active areas;
depositing polycrystalline silicon on the gate and epitaxial silicon on the active areas in a first process step;
etching polycrystalline silicon from the gate in a second process step, wherein during the second process step polycrystalline silicon is etched in two orthogonal dimensions; and repeating the first and second process steps a plurality of times.

17. The method of claim 16, wherein the semiconductor substrate further comprises an oxide region, and wherein no silicon is deposited on the oxide region during the first process step.

18. The method of claim 16, wherein after the first and second process steps are repeated a plurality of times, substantially no polycrystalline silicon exists in a region directly above the active areas.

19. The method of claim 18, wherein substantially no polycrystalline silicon exists on the gate after repeating the first and second process steps a plurality of times.

20. The method of claim 16, wherein during the first process step, polycrystalline silicon deposition and epitaxial silicon deposition occur simultaneously.

21. The method of claim 16, wherein the second process step comprises simultaneously etching epitaxial silicon from the active areas.

22. The method of claim 21, wherein the polycrystalline silicon is etched from the gate faster than the epitaxial silicon is etched from the active areas during the second process step.

23. The method of claim 16, wherein silicon is not deposited onto the semiconductor substrate during the second process step.

24. The method of claim 16, wherein the first process step is conducted at a lower temperature than the second process step.

25. The method of claim 24, wherein the second process step is conducted a temperature between approximately 800° C. and approximately 1200° C.

26. The method of claim 16, wherein the second process step is conducted a temperature of approximately 800° C. and approximately 1200° C.

27. The method of claim 16, wherein the semiconductor substrate is exposed to hydrochloric acid during the second process step.

28. The method of claim 16, wherein the semiconductor substrate is held at a pressure substantially equal to atmospheric pressure during the second process step.

29. A method comprising:
providing a semiconductor substrate in a processing chamber, the semiconductor substrate having a first surface and a second surface;
simultaneously performing epitaxial growth at an epitaxial growth rate over a first growth surface and polycrystalline growth at a polycrystalline growth rate over a second growth surface; and
controlling the epitaxial growth rate and the polycrystalline growth rate by periodically pausing the epitaxial growth and the polycrystalline growth to perform a flash etch back process, such that after the flash etch back process there is more epitaxial growth on the first growth surface than polycrystalline growth on the second growth surface.

30. The method of claim 29, wherein the semiconductor substrate further comprises an insulating region over which substantially no deposition occurs during the epitaxial growth and the polycrystalline growth.

31. The method of claim 30, wherein an etchant is supplied into the processing chamber during the epitaxial growth and the polycrystalline growth.

32. The method of claim 31, wherein the etchant is hydrochloric acid.

33. The method of claim 29, wherein the epitaxial growth and the polycrystalline growth are conducted at a lower temperature than the flash etch back process.

34. The method of claim 29, wherein hydrochloric acid is supplied to the processing chamber during the flash etch back process.

35. A method comprising:
providing a semiconductor substrate in a processing chamber having at least one oxide region and at least one non-oxide region; and
alternating a selective epitaxial growth process, during which epitaxial growth comprising polycrystalline growth and monocrystalline growth occurs in the at least one non-oxide region and during which substantially no deposition occurs in the at least one oxide region, with a flash etch back process, during which at least a portion of the polycrystalline growth is etched from the at least one non-oxide region.

36. The method of claim 35, wherein an etchant is supplied into the processing chamber during the selective epitaxial growth process.

37. The method of claim 36, wherein the etchant is hydrochloric acid.

38. The method of claim 35, wherein during the flash etch back process the polycrystalline growth is etched in two orthogonal dimensions.

39. The method of claim 35, wherein the deposition process is conducted at a lower temperature than the flash etch back process.

40. The method of claim 35, wherein hydrochloric acid is supplied to the processing chamber during the flash etch back process.

* * * * *